(12) United States Patent
Cugler-Fiorante et al.

(10) Patent No.: US 9,521,346 B1
(45) Date of Patent: Dec. 13, 2016

(54) SPATIO-TEMPORAL TUNABLE PIXELS ROIC FOR MULTI-SPECTRAL IMAGERS

(71) Applicants: Glauco Rogerio Cugler-Fiorante, Sao Paulo (BR); Payman Zarkesh-Ha, Albuquerque, NM (US); Sanjay Krishna, Albuquerque, NM (US)

(72) Inventors: Glauco Rogerio Cugler-Fiorante, Sao Paulo (BR); Payman Zarkesh-Ha, Albuquerque, NM (US); Sanjay Krishna, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 112 days.

(21) Appl. No.: 14/625,391

(22) Filed: Feb. 18, 2015

Related U.S. Application Data

(60) Provisional application No. 61/941,226, filed on Feb. 18, 2014.

(51) Int. Cl.
| | | |
|---|---|---|
| H01L 27/00 | (2006.01) | |
| H04N 5/378 | (2011.01) | |
| H01L 27/146 | (2006.01) | |
| H01L 27/144 | (2006.01) | |

(52) U.S. Cl.
CPC .......... *H04N 5/378* (2013.01); *H01L 27/1446* (2013.01); *H01L 27/14609* (2013.01); *H01L 27/14652* (2013.01)

(58) Field of Classification Search
CPC ............... H04N 5/378; H01L 27/14609; H01L 27/1446; H01L 27/14652
See application file for complete search history.

(56) References Cited

U.S. PATENT DOCUMENTS

2016/0198101 A1* 7/2016 Bagwell ................... H04N 5/33
348/164

* cited by examiner

*Primary Examiner* — Tony Ko
(74) *Attorney, Agent, or Firm* — MH2 Technology Law Group LLP

(57) ABSTRACT

Provided is a readout integrated circuit (ROIC). The ROIC includes a memory for each of a plurality of pixels, an address selector to synchronize a subsequent bias voltage for each of the pixels, a reference voltage recover switch to subtract the initial bias voltage from an output voltage of the integrated circuit and to result an integrator voltage for a sample and hold block, and a pulse-width control circuit to prevent crosstalk of the subsequent bias voltage between first and second ones of the pixels while a pixel clock selects adjacent columns. The memory maintains an initial bias voltage for each pixel during an initial integration frame time and during a sample and hold readout processing time. The sample and hold readout processing time is utilized to write a subsequent bias voltage for each pixel for a subsequent integration frame time to allow the first one of the pixels to have a different bias voltage than the second one of the pixels inside each integration frame time.

19 Claims, 21 Drawing Sheets

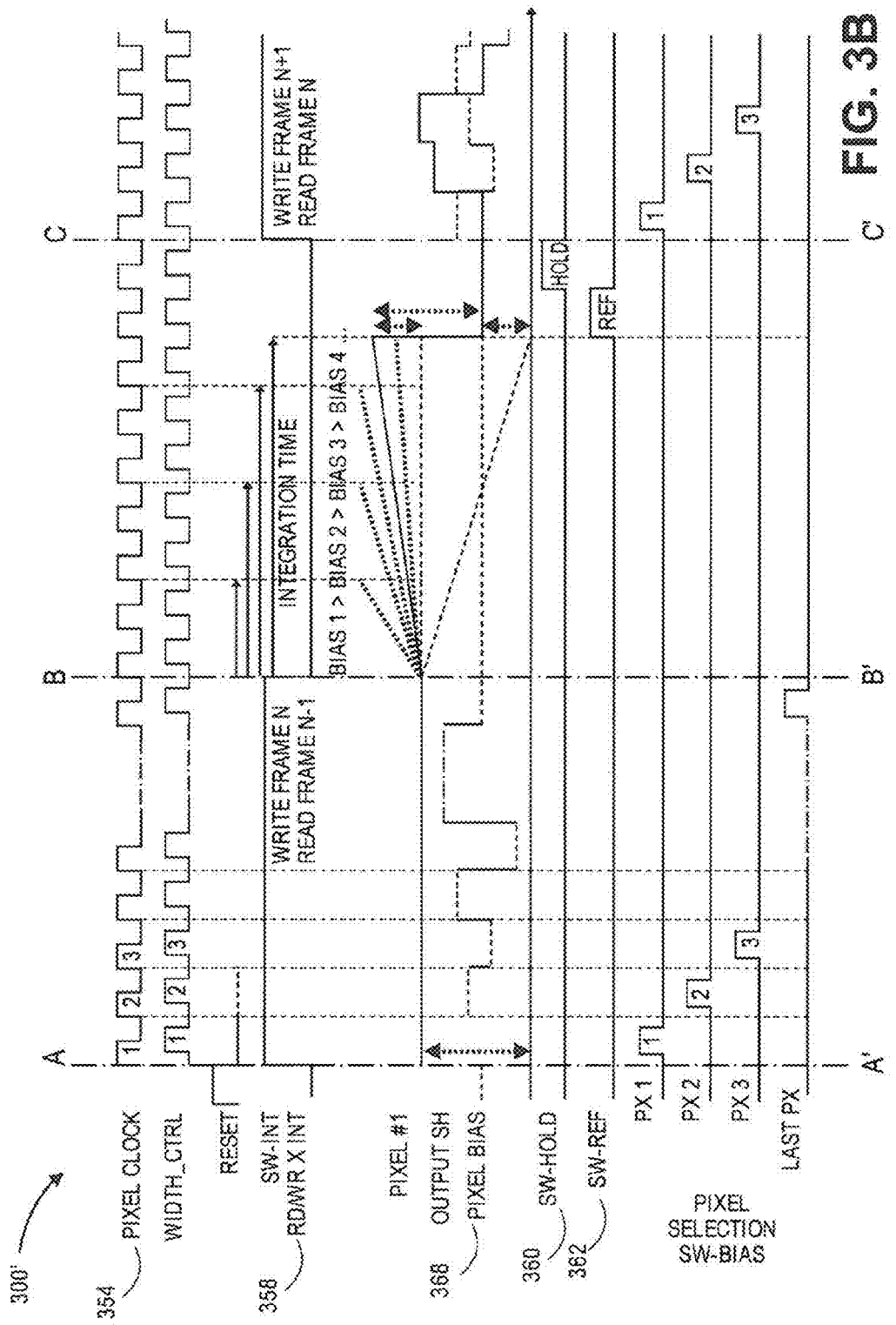

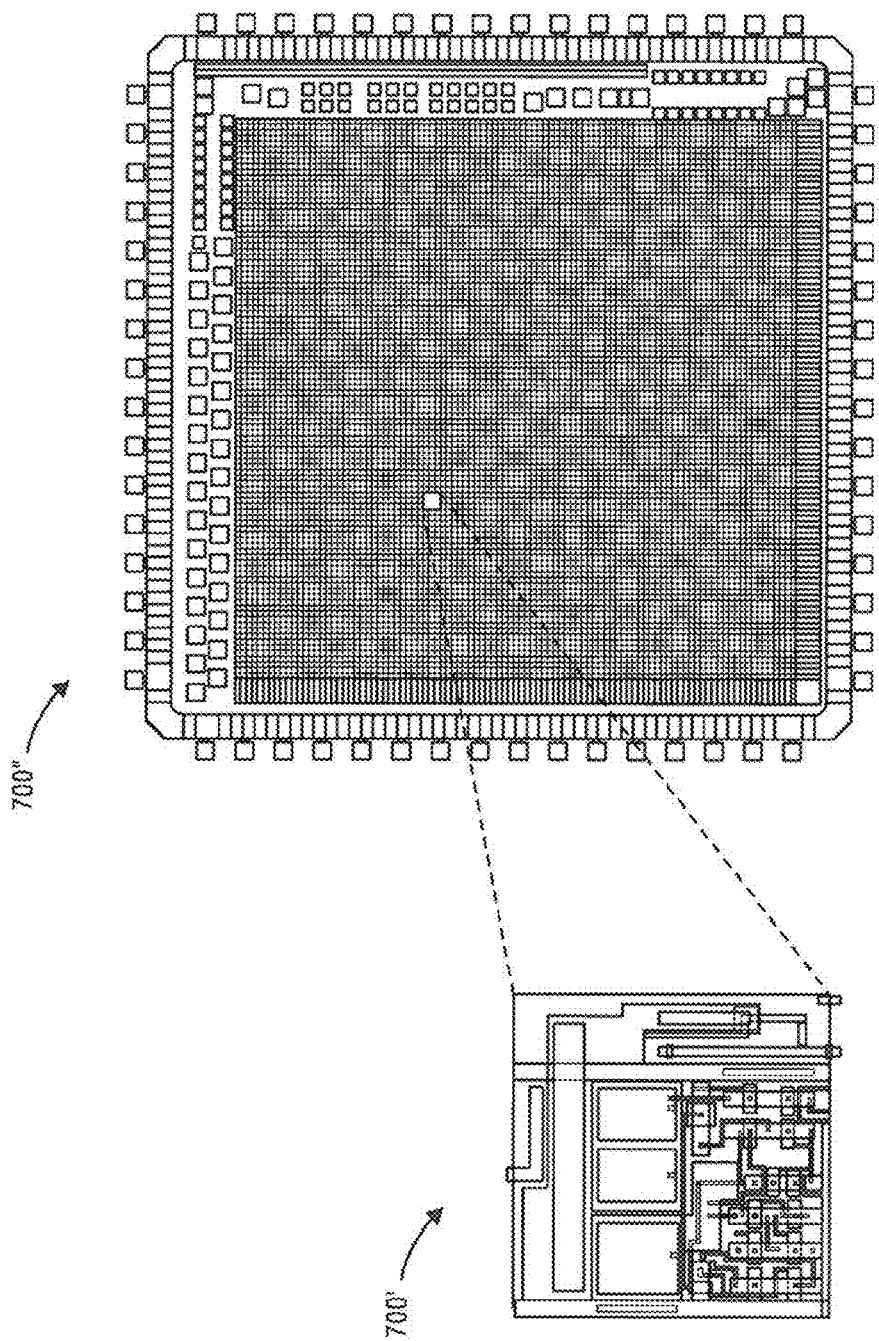

SPATIO-TEMPORAL TUNABLE PIXELS ROIC FOR MULTI-SPECTRAL IMAGERS

CROSS-REFERENCE TO RELATED APPLICATIONS

This application claims priority to U.S. Provisional Patent Application Ser. No. 61/941,226, filed Feb. 18, 2014, the entirety of which is incorporated herein by reference.

GOVERNMENT RIGHTS

This disclosure was made with Government support under Contract No. ECCS-0925757 awarded by the National Science Foundation. The Government has certain rights in the invention.

FIELD

This disclosure is generally directed to infrared detectors, in particular, readout-integrated circuit (ROIC) for providing detectors, such as visible light detectors and infrared detectors, with enhanced pixel functionality, and more specifically to modified capacitive transimpedance amplifier CMOS ROIC architecture.

BACKGROUND

There is an increasing demand on next generation infrared imagers to bring enhanced functionality to pixels. Such functionality could include control over the color, polarization, and dynamic range of the sensor, and could lead to the development of an infrared retina, and to enable other applications. An infrared retina is defined as an infrared focal plane array (IR-FPA) that works similarly to the human eye to receive different spectral responses (colors) on different spatial pixels, like rods and cones, but without the limitation of a fixed spectral response per pixel.

These developments at the sensor-level demands advanced spatio-temporal circuitry at the pixel level. One approach to realize an infrared retina involves the use of spectrally adaptive sensors that are bias tunable by exploiting the quantum confined Stark effect (QCSE) in the quantum dots in a well (DWELL) heterostructure. Combined with a projection algorithm, the QCSE can obtain a continuously tunable detector with overlapping wavelengths bands that can be used for target recognition. Only one focal plane array (FPA) may be used to realize multicolor images, reducing the prerequisite of different spectral bands sensors and the number of connections on same pixel. However, while commercially available ROICs offer a two-color, or dual-band, capability for quantum well infrared photodetectors (QWIP), they are based on dual stacked sensors, which require at least two contacts to the FPA. Moreover, the global pixel biasing in conventional ROICs does not allow advanced processing at the pixel level.

Accordingly, what is needed is an ROIC that provides a wide voltage range bias and the ability to independently control the voltage bias and its respective polarity on each pixel.

SUMMARY

In an embodiment, there is a readout integrated circuit (ROIC). The ROIC includes a memory for each of a plurality of pixels, an address selector to synchronize a subsequent bias voltage for each of the pixels, a reference voltage recover switch to subtract the initial bias voltage from an output voltage of the integrated circuit and to result an integrator voltage for a sample and hold block, and a pulse-width control circuit to prevent crosstalk of the subsequent bias voltage between first and second ones of the pixels while a pixel clock selects adjacent columns. The memory maintains an initial bias voltage for each pixel during an initial integration frame time and during a sample and hold readout processing time. The sample and hold readout processing time is utilized to write a subsequent bias voltage for each pixel for a subsequent integration frame time to allow the first one of the pixels to have a different bias voltage than the second one of the pixels inside each integration frame time.

In another embodiment there is a method for controlling a bias voltage for a plurality of pixels. The method includes maintaining an initial bias voltage for each of a plurality of pixels during an initial integration frame time and during a sample and hold readout processing time, writing a subsequent bias voltage for each pixel for a subsequent integration frame time to allow a first one of the pixels to have a different bias voltage than a second one of the pixels inside each integration frame time, and recovering an integrator voltage by subtracting the initial bias voltage from a total integrator output voltage. The method further includes compensating an integrator input offset voltage, a sensor voltage bias non-uniformity correction, or both on each pixel using external measuring, calculating, controlling, and feed backing of a corrected bias voltage. The method further includes controlling of a bias-switch pulse width to avoid crosstalk between the first and second pixels, wherein the first and second pixels are adjacent to one another.

Advantages of at least one embodiment include an ROIC that is capable of providing a large bias voltage in both polarities, independently on each individual pixel of an array. An advantage of at least one embodiment includes a small size unit cell per pixel. An advantage of at least one embodiment includes an ROIC for providing reduced cost for FPAs of visible light spectrum with or without color filters over the pixels and changing the biasing independently on each pixel. An advantage of at least one embodiment includes an ROIC that is capable of providing non-uniformity correction (NUC).

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 3B illustrates a timing diagram of main signals on the ITP-ROIC of FIG. 3A.

FIG. 7B shows a layout of a unit cell of the test chip of FIG. 7A.

FIG. 7C is a layout of the test chip of FIG. 7A.

DETAILED DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Described herein are embodiments of a spatio-temporal circuit for imaging sensors and that individually defines pixel-based voltages. In one implementation, spatio-temporal circuits of the embodiments are incorporated to operate in a spectra-tunable DWELL infrared camera.

Figure 1:
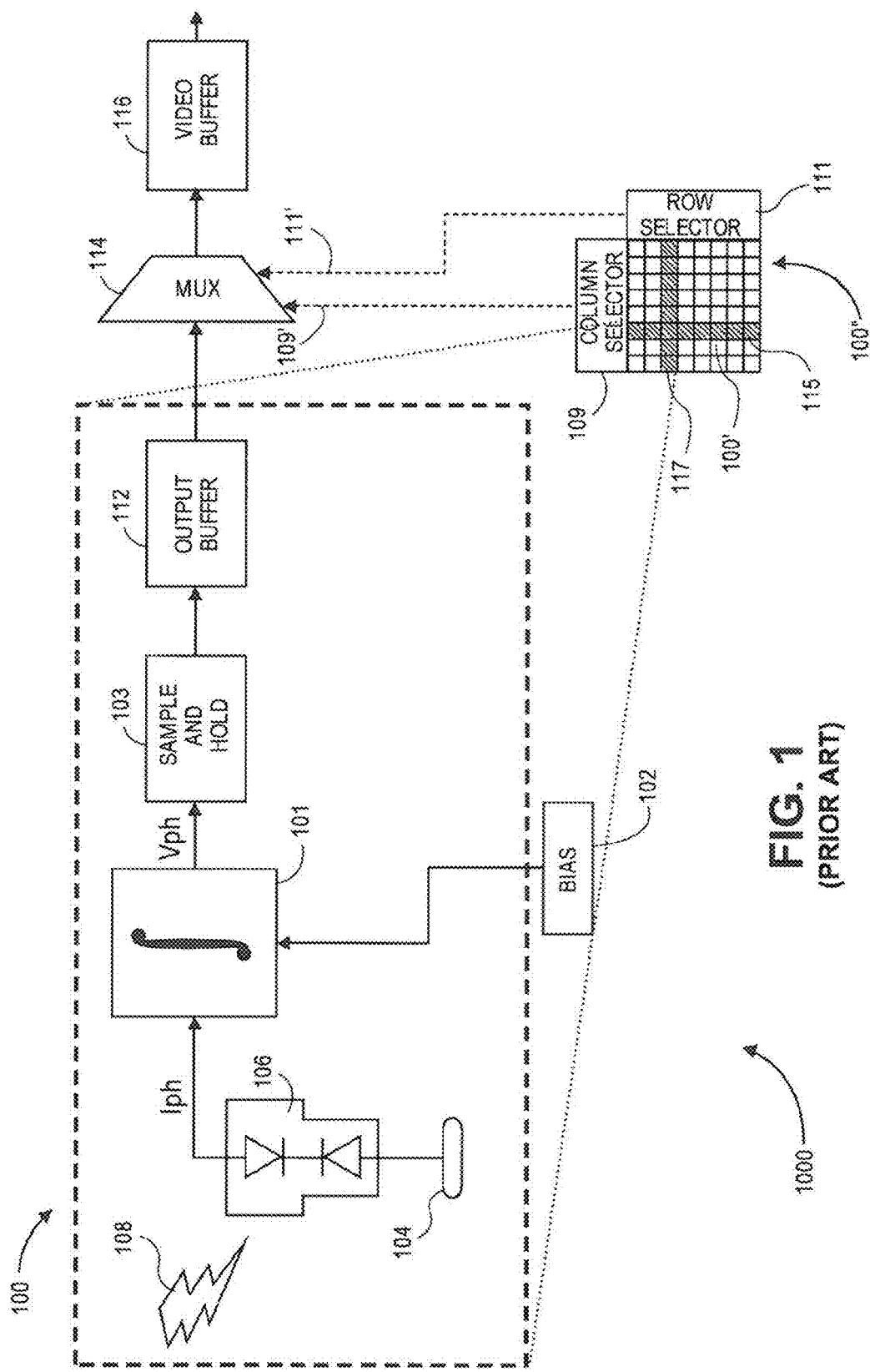
FIG. 1 is a block diagram that illustrates the operation of a conventional readout integrated unit cell.

As shown in block diagram 1000 of FIG. 1, a typical ROIC unit cell 100 consists of a photocurrent-to-voltage integrator 101, where the same bias value 102 (e.g., a fixed bias) is presented in all pixels 100' of a detector array 100", during each frame. The bias is applied with respect to a detector common (VDETCOM) node 104, generally the backplane (not shown) of the focal plane array (FPA). After an integration time, the value is stored in a sample-and-hold (S&H) block 103, keeping this value for external reading during the sweeping of all pixel addresses at a column 115 and a row 117 defined by a column selector 109 and a row selector 111, and provide column output 109' and row output 111' provided to a multiplexer 114, which outputs a signal to a video buffer 116. This is known as integrate-then-read frame-time process.

Figure 2A:
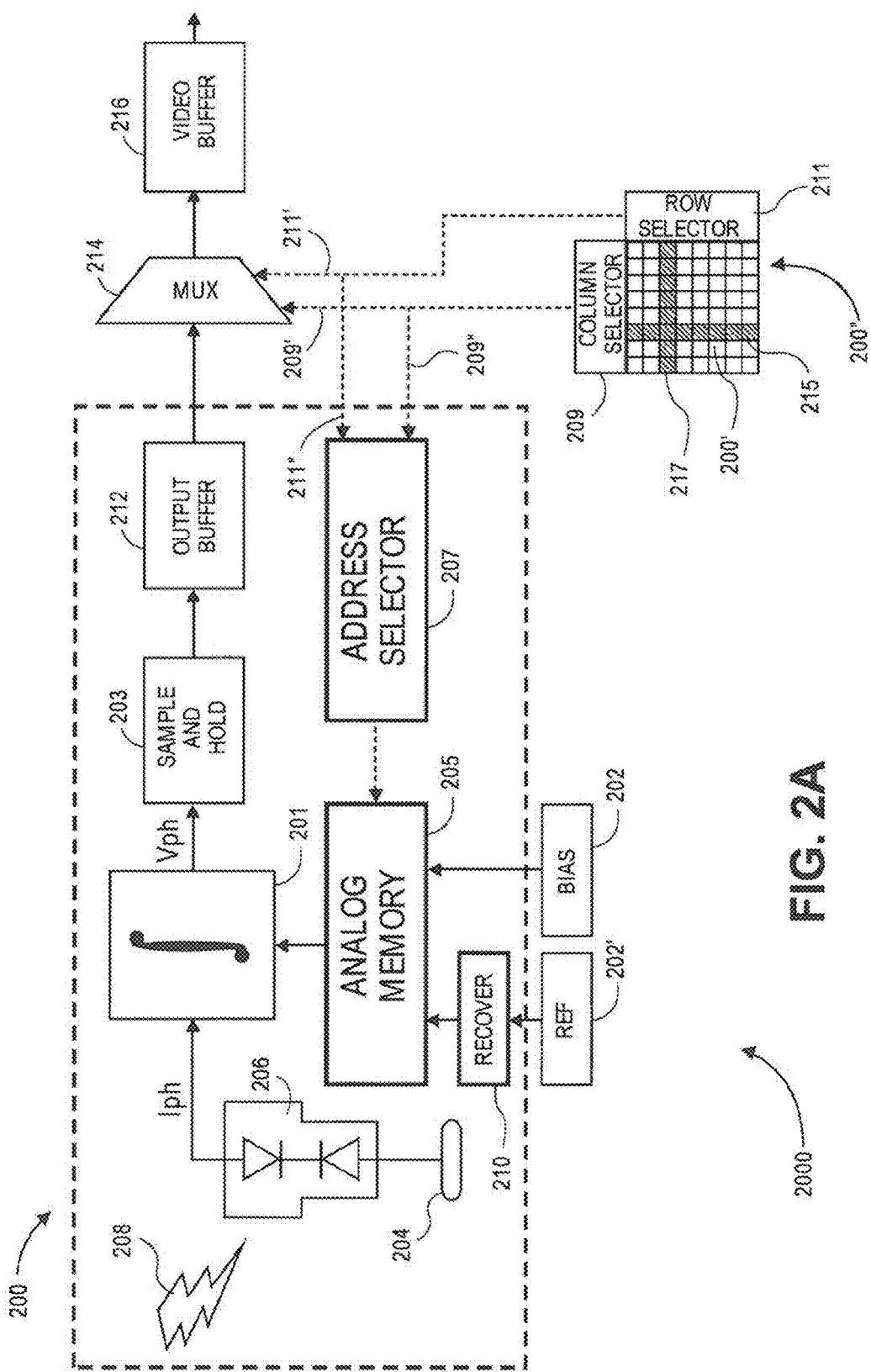
FIG. 2A is a block diagram that illustrates the operation of an individually tunable pixel readout integrated circuit (ITP-ROIC) of an embodiment.

Block diagram 2000 of FIG. 2A illustrates an embodiment of an ITP-ROIC unit cell 200. Unlike the conventional ROIC's that apply the same constant bias 102 across all pixels in a limited polarity selection and voltage range as discussed above for FIG. 1, the ITP-ROIC unit cell 200 includes a readout circuit capable of controlling each pixel voltage bias, and voltage polarity individually. One advantage of the ITP-ROIC of the embodiments is that it is capable of providing non-uniformity correction (NUC). By providing NUC, the ROIC is to able apply different bias on pixels that have different responses originating from statistical different constructions. By applying the different biases to each pixel, these non-uniformities may be compensated for at the same time, for example, by acquiring one dark frame and calculating/applying/adding a necessary correction. Furthermore, the unit cell 200 is capable of applying a dual polarity and large bias voltage to the detector devices, in smaller pixel pitch. Accordingly, in the case of a p-i-n-i-p sensor, for example, the unit cell could control the individual bias and polarity of each pixel such that the sensor could respond to red, green or blue just by changing the biasing, and without the need to use a filter for each pixel. These functions are made possible via implementation of three different, but integrated, blocks in each unit cell that include an analog memory capacitor 205, an address selector 207, and reference recover circuitries 210. Accordingly, in an embodiment there is an ITP-ROIC unit cell electronic circuit that may include an integrator, such as a CTIA integrator 201, a memory, such as an analog memory 205, an address selector 207, a reference recover switch 210, a sample-and-hold (S&H) stage 203, an output buffer 212. The output buffer 212 may feed signals to an output multiplex switch 214 which may feed a video buffer 216 to send image data to, for example, a display.

The ITP-ROIC unit cell 200 may include analog memory 205 for each one of a plurality of pixels of, for example, a photodetector, and address selector 207 to synchronize an external desired bias to one or more of the plurality of pixels. For example, in an embodiment memory 205 maintains the bias voltage 202 during an initial integration frame time and during a sample and hold readout processing time. The sample and hold readout processing time may be utilized to "write" an individual bias for a next, that is, a subsequent integration frame. In this way, a different pixel biasing (spatial bias) is provided inside each frame time (temporal bias). That is, the sample and hold readout processing time is utilized to write a subsequent bias voltage for each pixel for a subsequent integration frame time to allow a first one of the pixels to have a different bias voltage than a second one of the pixels inside each integration frame time. The address selector 207 may, therefore, synchronize the subsequent bias voltage for each of the pixels. Also included may be an implemented voltage reference restoration block, for example, a reference voltage 202' recover switch 210, to subtract the initial pixel bias voltage from an output voltage, such as the integrated voltage of the integrated circuit, so that the result (an integrator voltage Vph) is sent to the S&H stage 203 for external readout.

Figure 2B:
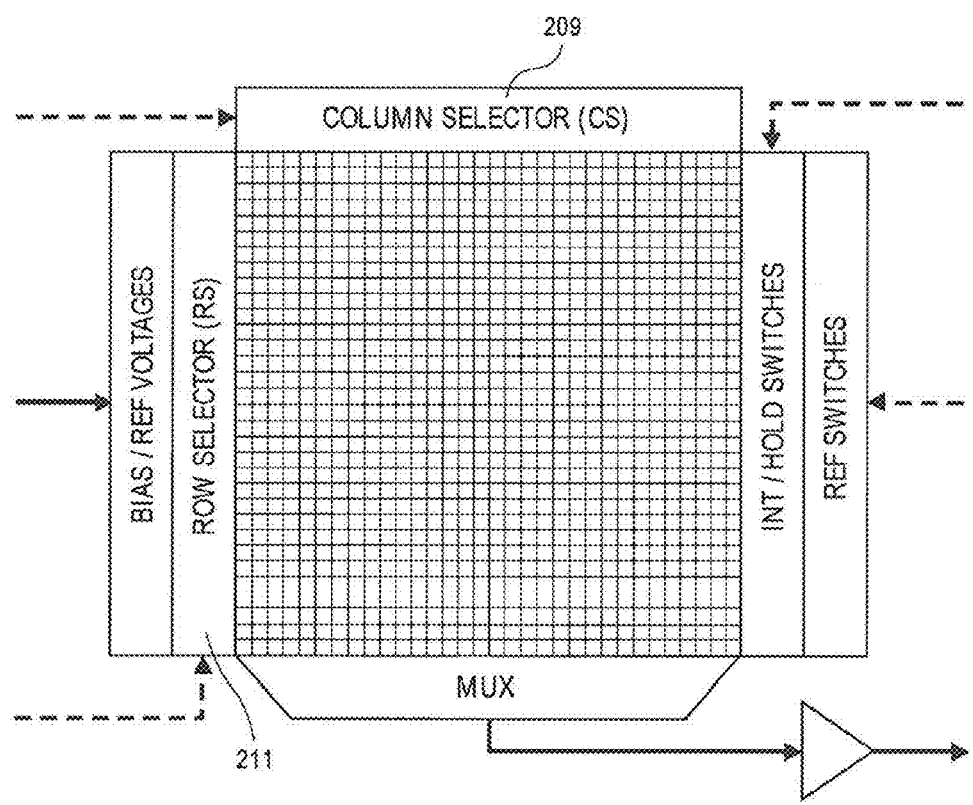
FIG. 2B illustrates an ROIC demultiplexer of the ITP-ROIC of FTG. 2A.

The unit cell electronic circuit design may be compact, simple, and reliable to execute, for example, digital and analog functions. Such digital functions may be implemented to control row-versus-column selective transfer of an external voltage bias to the analog memory 205, an integration process, voltage reference recover, a sample of a recovered voltage, and for outputting voltage transferring to a column multiplex input. Analog functions may include memorizing a pixel-specific voltage bias, transferring this voltage bias to the coupled sensor, integrating the photocurrent generated by the sensor, converting the photocurrent charge into a voltage, recovering a reference voltage level and holding the processed voltage for external reading. The reading of each pixel integrated value may be accomplished by a column selector (CS) 209 and row selector (RS) 211, which may work as unit cell signal multiplexers as shown in FIG. 2B. Pixel clock pulses 354 applied to column selector clock pin, line sync pulses 352 applied to column selector reset pin and also applied to row selector clock pin, and frame sync pulses 358' applied to row selector reset pin sweep and select one column 215 and one row 217 at a time, addressing one specific unit cell 200' in the matrix 200".

Figure 3A:
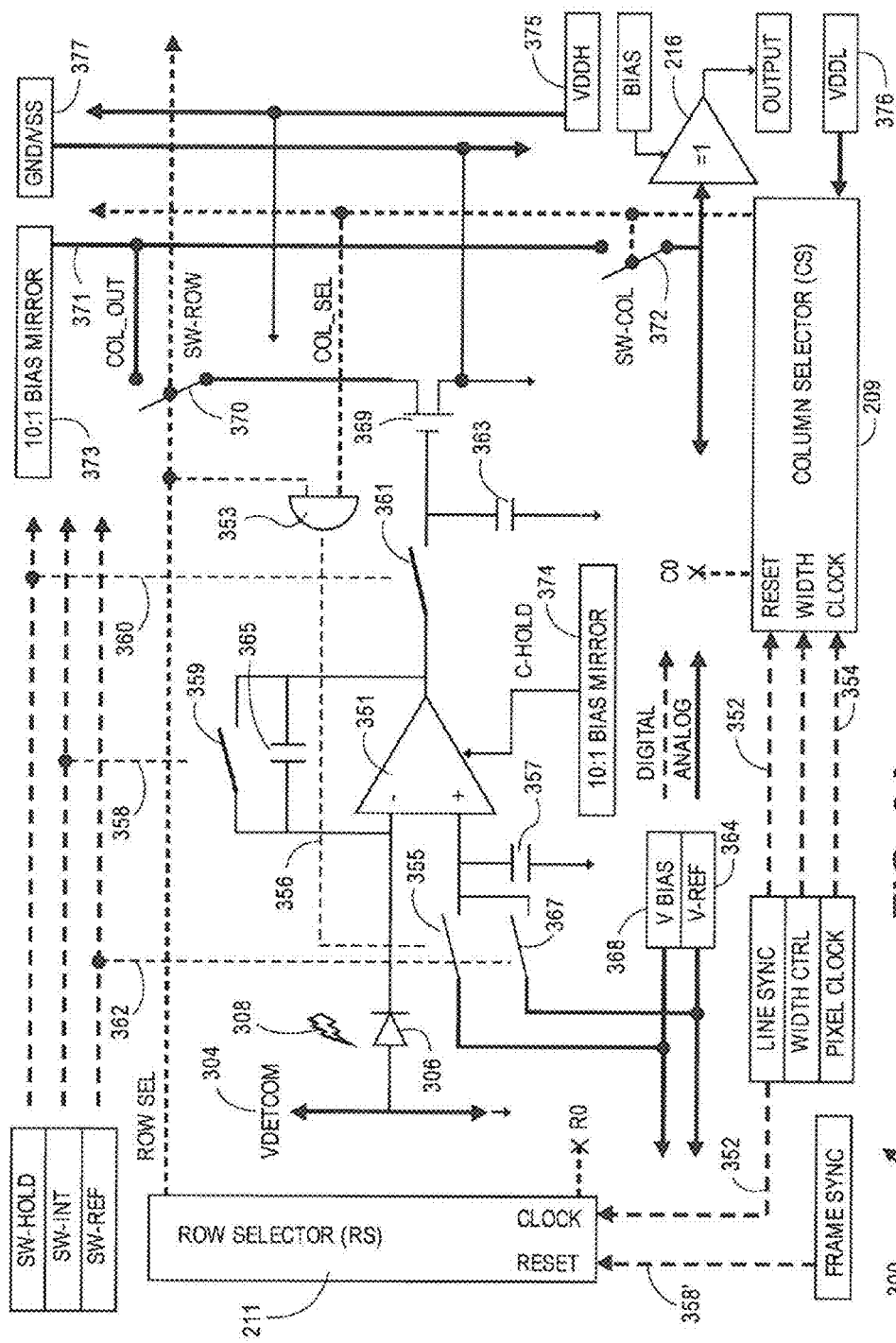
FIG. 3A illustrates a circuit implementation of an ITP-ROIC unit cell of the embodiments.

Shown in FIG. 3A is a circuit implementation and peripheral circuit block diagram 300 of a unit cell, such as the ITP-ROIC unit cell 200 of FIG. 2A. Among other things, an integrator, such as a capacitance transimpedance amplifier (CTIA) 351, is included to provide high linearity, detector bias stability and for applying positive and negative biases to a detector 306. In FIG. 3A, solid lines represent analog signals while dashed lines represent digital signals.

The operation of the circuit in FIG. 3A is described with respect to a timing diagram 300' in FIG. 3B for the dark-current response (covered chip), showing a pixel bias for Pixel 1 in full cycle. For example, as column selector 209 receives reset 352 and clock 354 pulses, and row selector 211 receives reset 352 and frame sync 358' pulses to activate an output of a specific pixel, internal address selector circuitry (represented by the AND-gate 353 in FIG. 3A), activates bias switch 355 via signal 356 (SW-BIAS), which allows transfer of the desired external bias voltage 368 (V-BIAS) to the analog memory capacitor 357 (C-MEM).

After the initial reset and on the start of a frame (indicated by vertical dash-dot line A-A' in FIG. 3B), the integration switch 359 controlled by signal 358 (SW-INT) is turned on. The opamp 351, therefore, operates as a buffer, reflecting a voltage maintained on analog memory capacitor 357 to the detector 306 through switch 359. It is noted that detector 206 and 306 may be a photodetector, such as an IR detector, a p-i-n-i-p amorphous silicon image sensor, including CMOS-compatible photodiode and/or a quantum dots in a well (DWELL) detector, and may therefore convert electromagnetic energy 208, 308 into electricity. The detector may be one of several detectors arranged in, for example, a focal-plane array (FPA). Thus, each detector of the FPA may have one terminal connected to a common point with a defined bias voltage 304, and another terminal connected to an ROIC via, for example, indium bumps. While integration switch 359 is closed, a sequential sweeping selection of unit cells for writing bias in the memory capacitor 357 of each unit cell in this frame (N) and for simultaneously reading the value contained in the hold capacitor 363 (C-HOLD) from a previous frame (N-I) occurs. A sample-and-hold switch 361 controlled by signal 360 (SW-HOLD) is kept "off" during the writing/reading process and during most of the integration time.

At the end of the writing/reading process (designated by vertical dash-dot line B-B'), integration switch 359 is opened and the reverse-biased detector's 306 current charges integrator capacitor 365 (C-INT) proportional to the applied bias and time of integration. During the integration time (i.e., between vertical dash-dot lines B-B' and C-C' of FIG. 3B), both RS 211 and CS 209 may be reset to avoid activation of bias switch 355 and/or to avoid any change in the bias, and reducing any noise generated by the clock/pixels scanning.

After the desired integration time, each of the capacitors 365 acquires the original bias added with an integration value. By turning on the reference switch 367, which is controlled by signal 362 (SW-REF), an external reference voltage 364 (V-REF), which may be zero volts, is transferred to capacitor 357 and reflected over each one of the corresponding detectors 306, resulting only in an integrated voltage in the opamp output. Subsequently, turning on the sample and hold switch 361 (SW-HOLD), the capacitor 363 is charged with the same integrated voltage existing in the opamp output. After that, the hold switch 361 is opened and the capacitor 363 keeps (memorizes) the voltage aiming to be read in the next frame. The output buffer 369—biased by mirror transistor 373 (10:1 Bias Mirror) (shown as 673" in FIG. 6A)—repeats the voltage on capacitor 363 to the output video buffer 216. This occurs when both switches, that is switch 370 (SW-ROW) and switch 372 (SW-COL) (shown as switch 672 in FIG. 6A) of the respective unit cell, are selected by the writing/reading sweeping process. The timing of one line-scan is used as the minimum integration time, allowing, if needed, synchronization and visualization of the specific unit cell integration values on these "hidden" lines on a frame grabber.

It is noted that a line-scan time, i.e., number of clock pulses, is the step of an integration time parameter. While not limited to any particular theory, it is believed that the limitation of maximum integration time occurs when some noise/leakage current matches a small photocurrent and avoids the capacitor to integrate its charge. The actual value may be limited via a controlling program that, when reached, turns off the hold pulse. The pixel clock versus a desired FPS is related with the integration time. Alternatively, a current of the detector, together with the integration capacitor and voltage range on CTIA may define the pixel clock and the FPS.

The mirror transistor 373 (10:1 BIAS MIRROR) of FIG. 3A (shown as 673 in FIG. 6A) generates a bias current for each column, aiming to biasing the output buffer of the unit cell in the ideal operational point. The 10:1 BIAS MIRROR 374 (shown as 474 in FIG. 4) generates—externally to the operational amplifier of the unit cell—the bias current necessary for the opamp operation. VDD or VCC is the positive integrated circuit (IC) power supply pin; for example, VDDH 375 can be 15 VDC and VDDL 376 can be 3.3V. GNDNSS 377 is the negative IC power supply pin; it is the Ground of the chip, the silicon substrate, denoted as Voltage at the MOSFET Source pin (VSS), and it can be 0VDC. VDETCOM 304 is the reference voltage for the biasing of the detectors, and may be half of VDDH 375, for example 7.5V. This voltage is applied to the chip related to VSS. For example, if +2V are provided in a specific pixel detector, then 9.5V (i.e., 7.5V+2V) must be applied in the V-BIAS pin, related to VSS. If instead −2V are provided in a detector, then 5.5V (i.e., 7.5V−2V) must be applied in the V-BIAS pin, related to VSS. Accordingly, independently positive and negative biasing on different pixels detectors may be provided.

Figure 5:
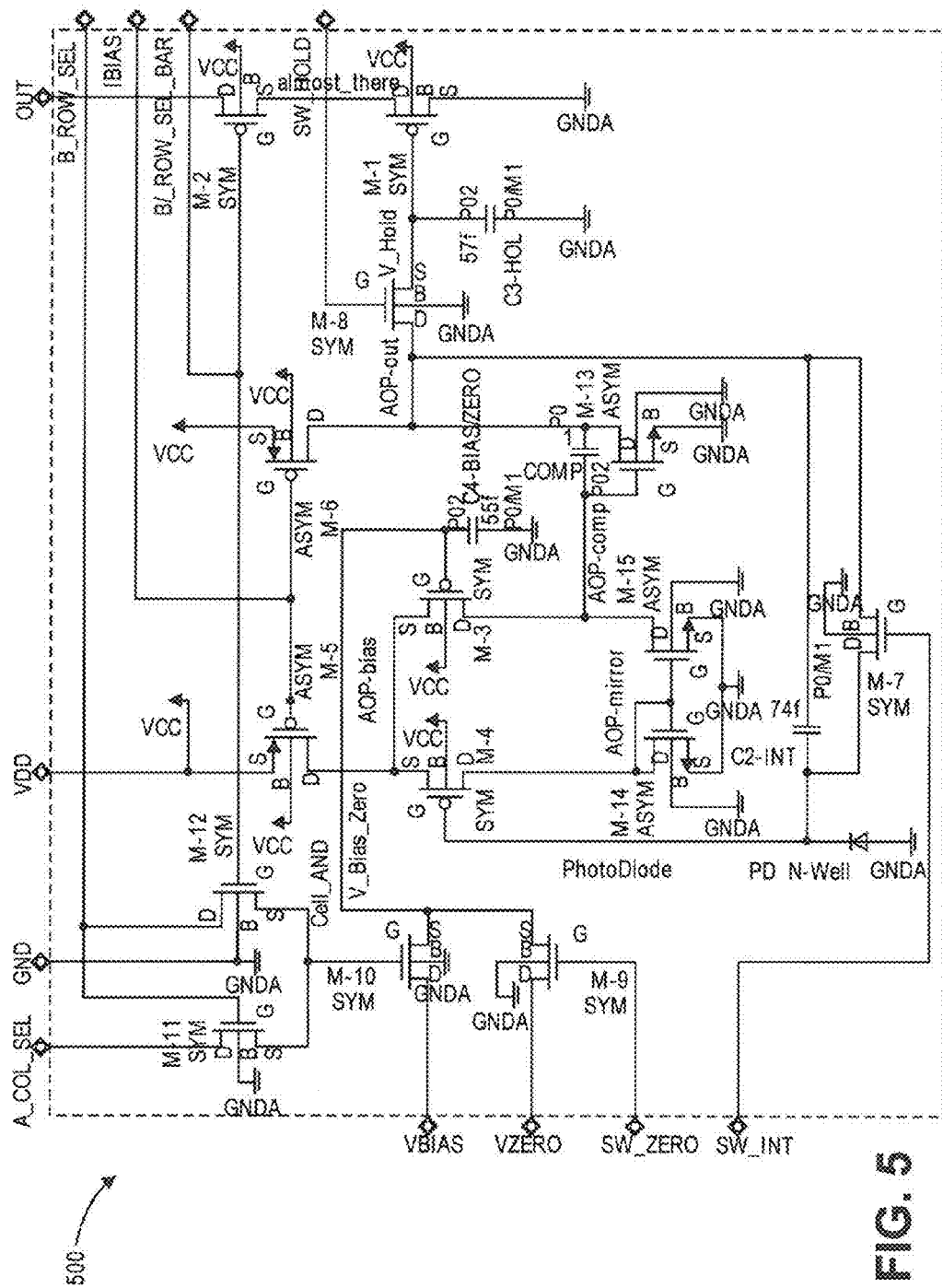
FIG. 5 is a circuit diagram of a unit cell of an embodiment.

SW-ROW 370 in FIG. 3A is the M-2 transistor in FIG. 5 and it works as a switch—part of the multiplexer 214—to connect the analog output of the unit cell to the respective column. COL OUT 371 is the electrical node that connects the OUT pin shown in FIG. 5 to the COL_OUT input pin shown in FIG. 6A, receives the bias current from the column selector and transfers the memorized voltage contained in the hold capacitor 363 to the output via video buffer 216. SW-COL 372, 672 is a transmission gate—part of the multiplexer 214—located in the column selector. At writing/ reading process, only one line is selected and only one column is selected by the pixel clock and line sync signals. Each line turns on 96 M-2 transistors and each column turns on only one bidirectional switch (SW-COL). By this way, only one pixel is connected to the output buffer at a different time or different pixel clock pulse.

EXAMPLES

Unit Cell Operational Amplifier

Figure 4:
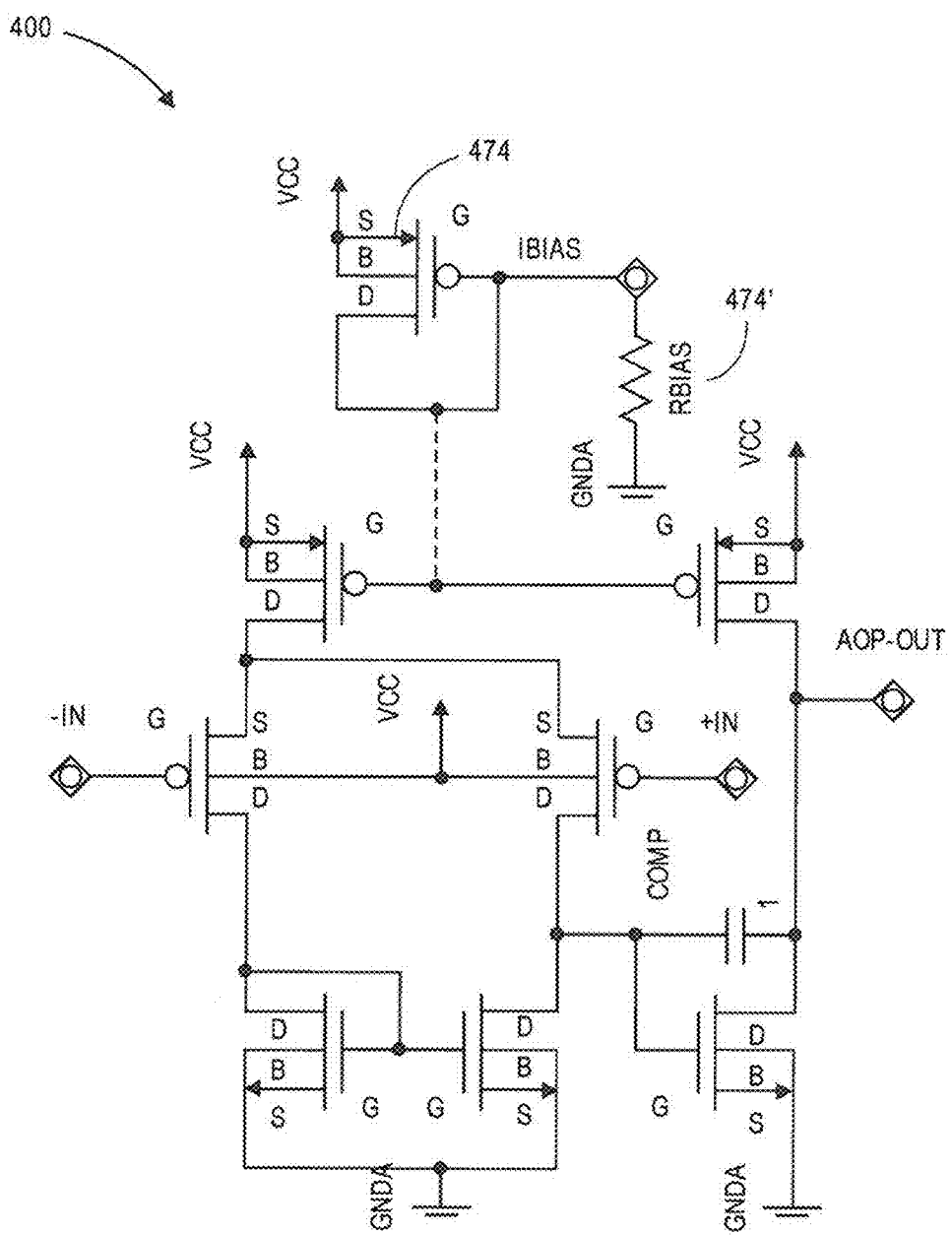
FIG. 4 is a circuit diagram of a two-stage operational amplifier that may be adopted in a unit cell of an embodiment.

A two-stage operational amplifier (opamp) with only seven transistors was designed and used to implement a CTIA. An electronic circuit 400 of the two-stage operational amplifier adopted in the unit cell is shown in FIG. 4. Table 1 includes exemplary opamp specifications. The opamp supply voltage may be defined as +/−7.5 V and its bias current as 1 µA. To save space on layout, the output bias-current mirror transistor was implemented outside the unit cell, and the input bias-current was generated externally by a resistor 474' on a 10x-size mirror transistor 474 (shown as 374 in FIG. 3A).

TABLE 1

| | |
|---|---|
| Dynamic Range | −7.3 V to 6.7 V |
| Offset | 116 µV |
| Power | 95.9 µW |
| ft | 42 MHz |
| Gain_dB | 64.4 |
| f3db | 47 kHz |
| Phase margin | 13.4 Deg |
| Slew rate (rise) | 84 V/µs |
| Slew rate (fall) | −132 V/µs |

Unit Cell

A unit cell was assembled based on the detailed electronic circuit diagram 500 shown in FIG. 5. Items M3, M4, M5, M6, M13, M14 and M15 made up the operational amplifier of the CTIA. Item "COMP" is a frequency compensation capacitor. Item C4 is a bias/zero capacitor. Item C2 is an integration capacitor. Item C3 is a HOLD capacitor. Item M10 is the bias switch. Item M9 is the reference voltage switch. Item M7 is the integration switch. Item M8 is the hold switch. Item M1 is the output buffer. Item M2 is the column input-multiplexer switch. Items M11 and M12 are the unit cell address selector.

Row/Column Selector

A row and column selector was used. The selector included a 99-output shift-register built with 100 D Flip-flops (DFF) using low voltage devices (3.3 V) with a minimum transistor width/length size of 0.9/0.35 µm/µm.

Column Driver/Level Shifter

Figure 6A:
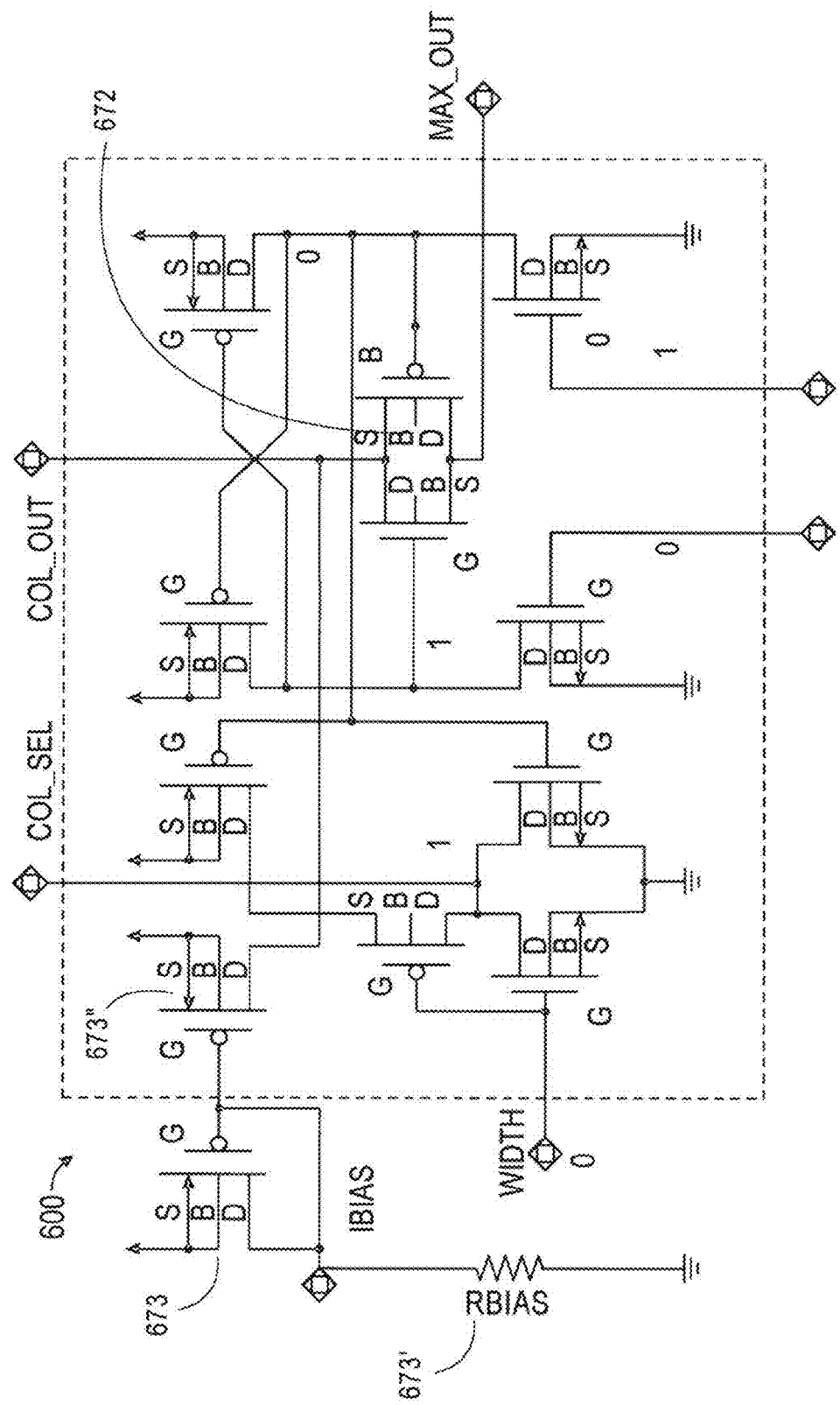
FIG. 6A illustrates a level shifter, column bias mirror, selector, width control, DEMUX circuit diagram of an embodiment.
Figure 6B:
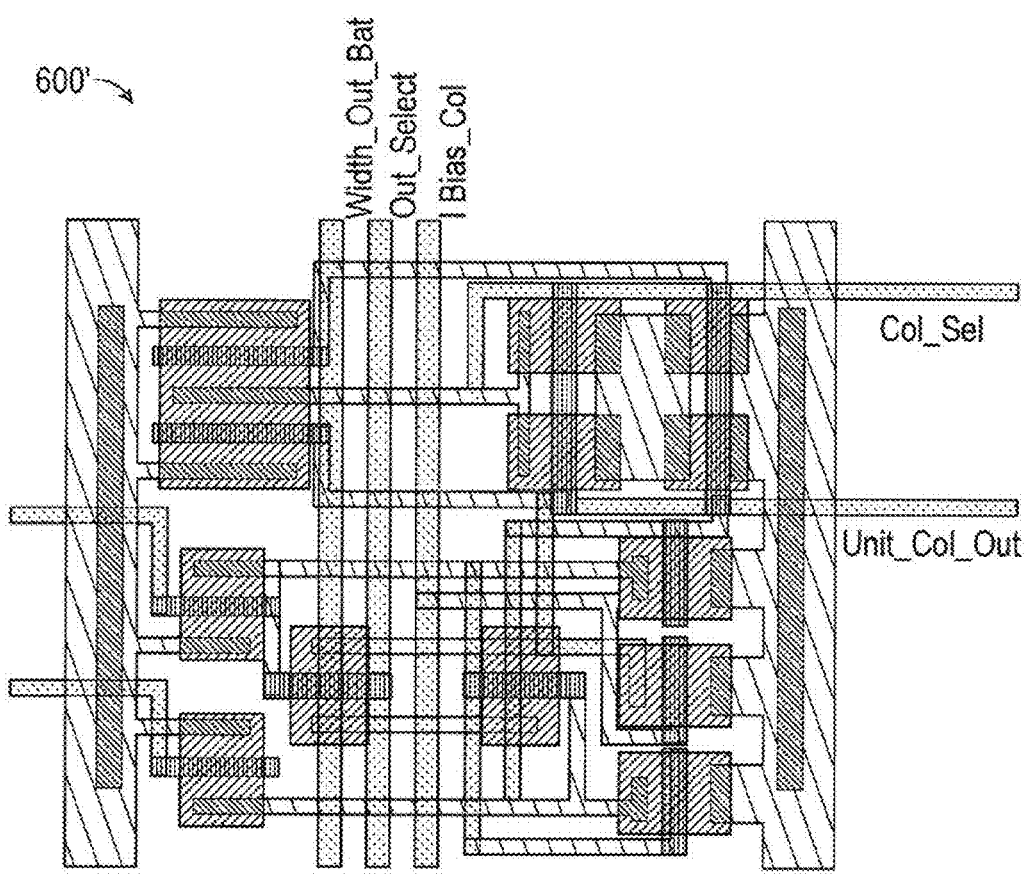
FIG. 6B illustrates a circuit layout of the circuit of FIG. 6A.

The low voltage output of the row and column selector must be modified to high voltage to control the unit cells. A standard level-shifter was used for the row select. However, in addition to a standard level-shifter, the column select contains the control signal ("width") to avoid cross-talk of the bias voltage between two adjacent pixels while the pixel clock selects adjacent columns. In addition, the column driver contains an analog multiplexer to generate a video signal. The schematic 600 of the column level-shifter electrical circuit is shown in FIG. 6A along with a circuit layout 600' in FIG. 6B. As illustrated, the circuit includes one transistor 673" that mirrors the column-bias current, the multiplexer switch 672 (shown as 372 in FIG. 3A), and a 2-input NOR-gate, which externally controls the width of the column selection pulse. The column bias transistors are mirrored on a 10x-size transistor 673 (shown as 373 in FIG. 3A) that has a bias current of 20 µA defined by an external resistor 673' to GND.

Output Video Buffer

An output video amplifier was used. The amplifier included a single-stage opamp that was made as a buffer (e.g., 216 in FIG. 2A), and received the signal of each column through switches (e.g., 372 of FIG. 3A) of the columns multiplexer. An output video buffer used high voltage (+/−7.5 V) and drew 13 µA current for its bias.

Test Chip

Figure 7A:
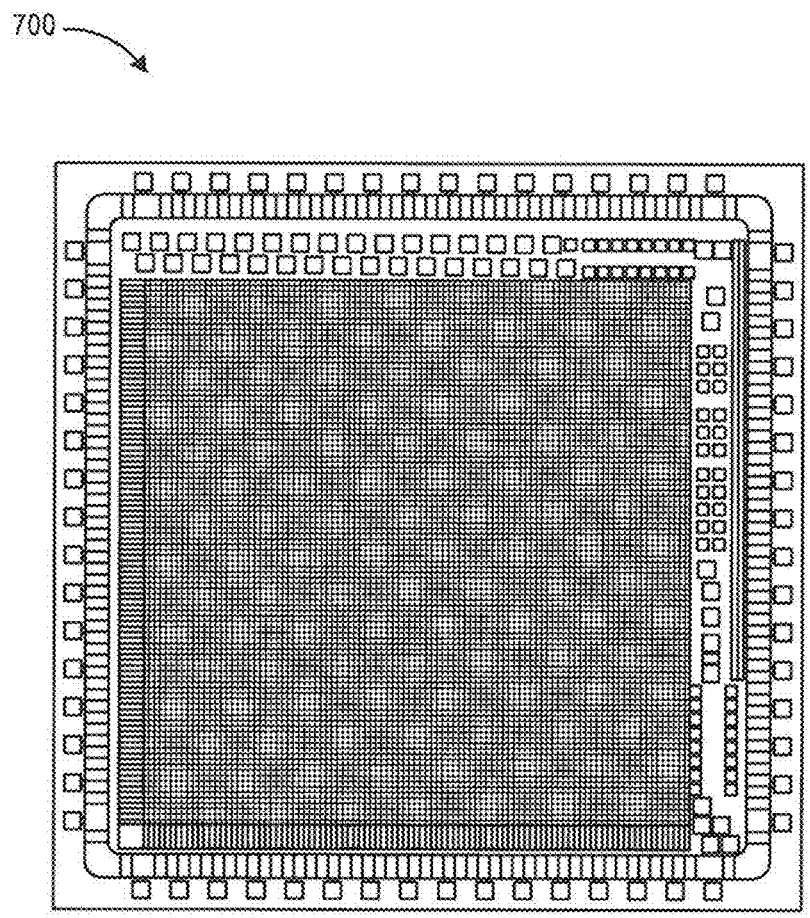
FIG. 7A is a micrograph of a test chip of an embodiment.

A 96×96 pixel test prototype chip was designed and fabricated in a double-poly, four-metal layer, standard 0.35 mm mixed-signal 3.3/15 V TSMC high-voltage CMOS process. A micrograph 700 of the die, with a total size of 5.14×5.14 mm2 is shown in FIG. 7A with the main circuits identified. A layout 700' of the unit cell and a layout 700" of the chip are shown in FIGS. 7B-7C, respectively. The pixel has 15 transistors and four capacitors designed in a 30×30 µm$^2$ area at a pitch of 40×40 µm$^2$ to fit the photodiodes. Considering 320 µm$^2$ of area not covered by metal layers, the fill factor is 20%.

Table 2 below summarizes features of the 96×96 pixel test prototype chip.

TABLE 2

| | |
|---|---|
| Technology | TSMC 0.35 µm CMOS 2P4M |
| Power Supply (Low Voltage Section) | 3.3 V |
| Power Supply (High Voltage Section) | 15 V |
| Die size (including pads) | 5.14 × 5.14 mm$^2$ |
| Total pixels array size | 98 × 98 |
| Active Pixels array size | 96 × 96 |
| Pixel pitch | 40 × 40 µm$^2$ |
| Pixel size | 30 × 30 µm$^2$ |
| Photodiode type | n+/n-well/p-sub |
| Fill factor | 20% |
| Unit Cell transistors | 15 |
| Unit Cell capacitors | 4 |
| Integrator capacitor (365) | 74 fF |
| Analog memory capacitor (357) | 55 fF |
| Hold Capacitor (363) | 57 fF |
| Integration time | 0.84 to 245 ms |
| Input voltage swing | 10 V |
| Output voltage swing | 7.8 V |

FPGA-Based Test and Characterization System

Figure 8:
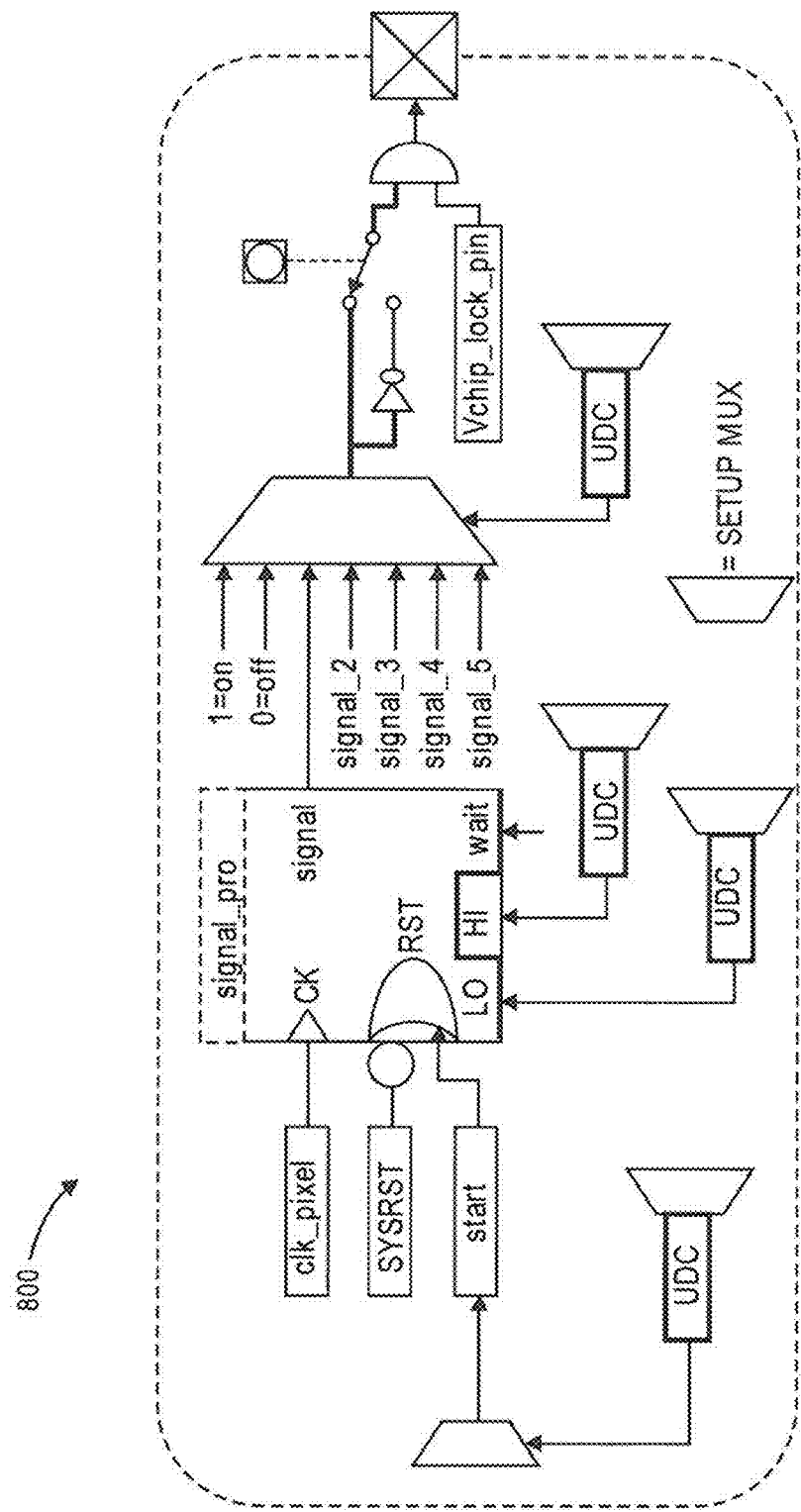
FIG. 8 is a block diagram of one signal generation on an FPGA-based test and characterization system.

Several analog and digital signals are necessary to generate so that the ITP-ROIC can be tested. A MicroBlaze Development Kit Spartan-3S1600E from Xilinx was chosen because of its low cost, stand-alone characteristic, key features for signals generation, image acquisition, as well as processing and display. FIG. 8 shows the basic signal generation block diagram 800, with the up-down/pulse generation counters and the signal/setup parameters multiplexers. At least 26 signals, with 80 adjustable parameters were used for the testing system as a whole. The chips were mounted and wire bonded to a 68 pins open-cavity leadless chip carrier (LCC) package for use with ZIF sockets on specific designed PCB. The main power supply was set to 18V and supplies several LM317 for regulation of 15V, 7.5V, 5V, 3.3V. A CD4504B was used for the level shifter from 3.3V of the FPGA board to 15V on FPA. TL082 opamp was also used as a buffer to increase the impedance of oscilloscope probe, from 10 MΩ to 1 TΩ.

Experimental Results

Figure 9:
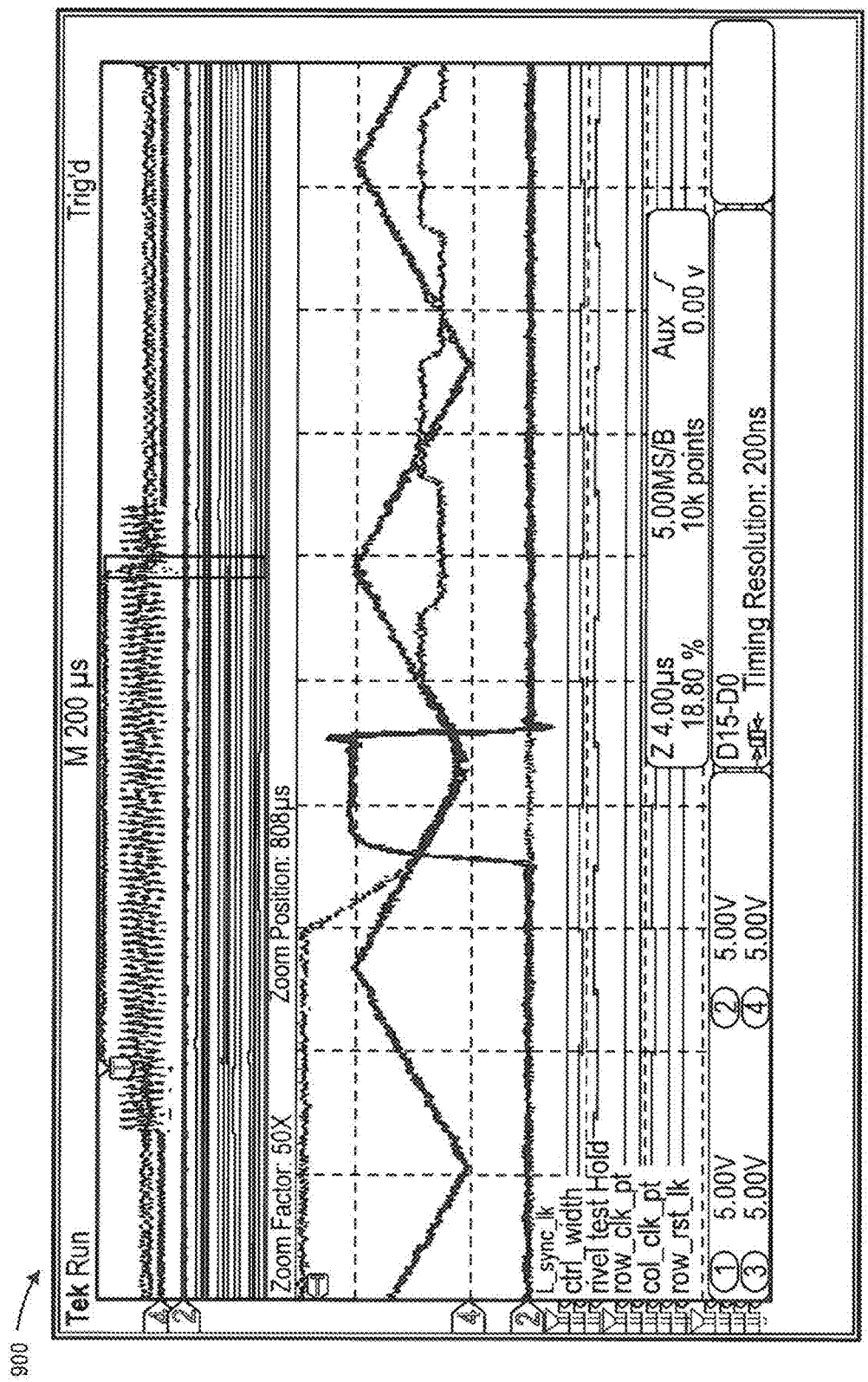
FIG. 9 shows test data for a column selector output and video output in hold.
Figure 10A:
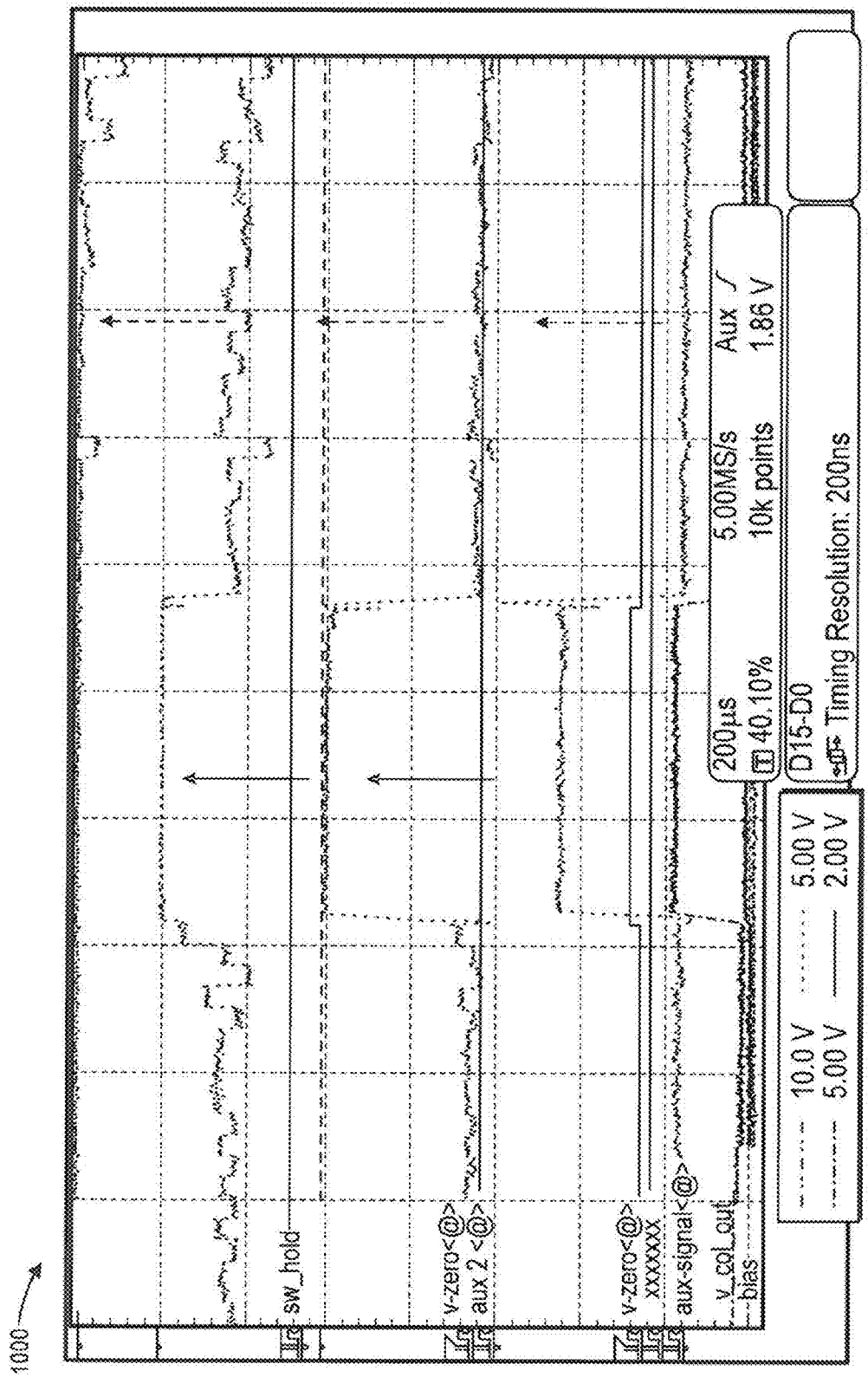
FIG. 10A shows test data for integration with 2 biases during sweeping in one row.
Figure 10B:
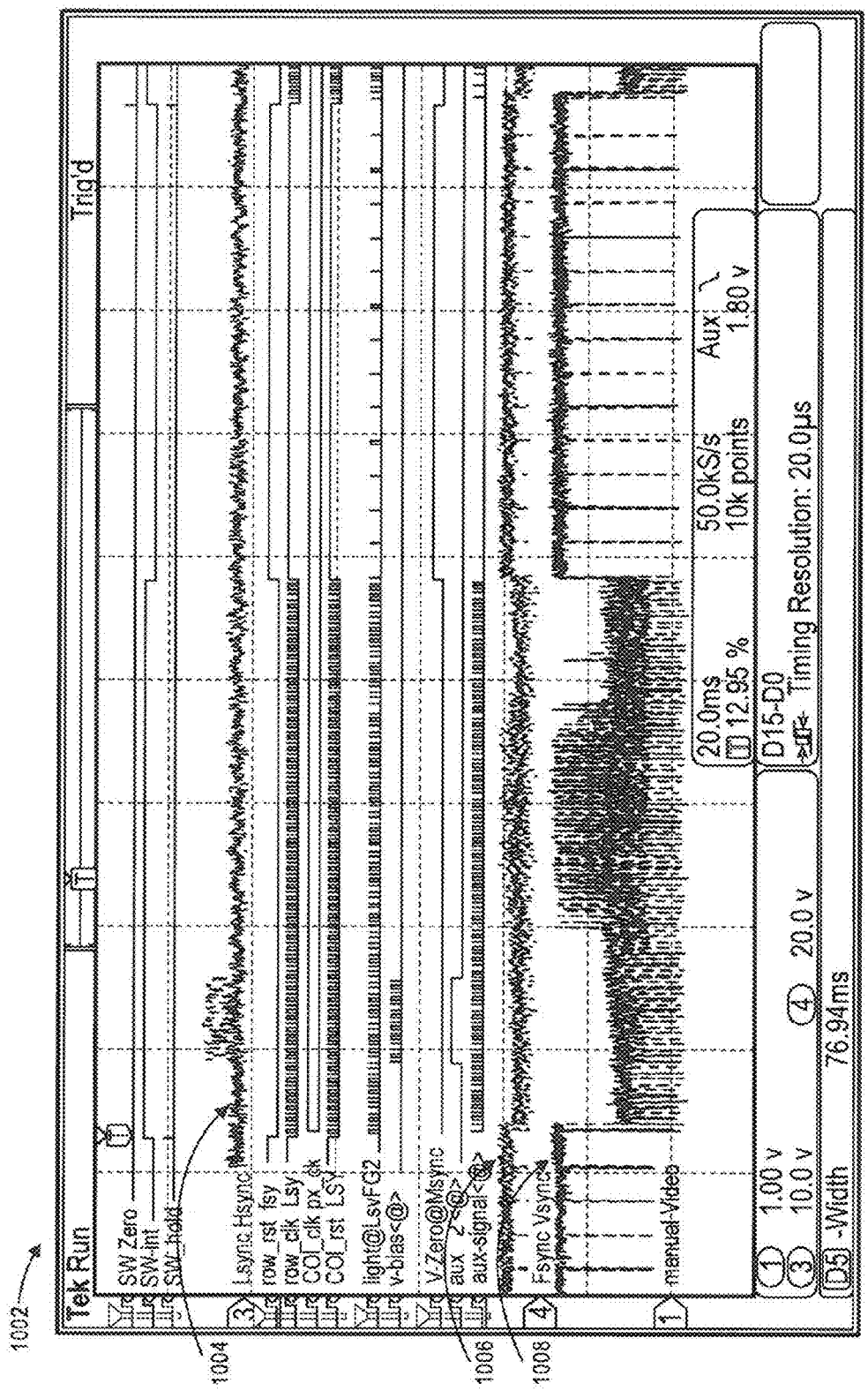
FIG. 10B shows test data for waveforms of generated digital signals, analog measurements, and ITP-ROIC video output.

Several test structures were implemented on the test chip, in order to characterize each device in the unit cell and also allowing the reconstruction of the unit cell with discrete components. The FPGA based infrastructure has been utilized as a functional and versatile tool for signal generation and FPA testing and characterization. The group of demultiplexer switches, column selector and output buffer proved to work correctly, as shown in the graph 900 in FIG. 9. Two biases with correlated different integration rate are shown in the graph 1001 in FIG. 10A for the FPA reading. Following adequate signals generation, connection, and synchronization, the ITP-ROIC was able to reset, bias, integrate, reference, hold, and transfer the acquired image to the frame grabber. Graph 1002 in FIG. 10B shows the main digital signals, detaching the analog signals BIAS (1004), the ITP-ROIC output (1006), and the amplified video signal (1008).

Figure 11:
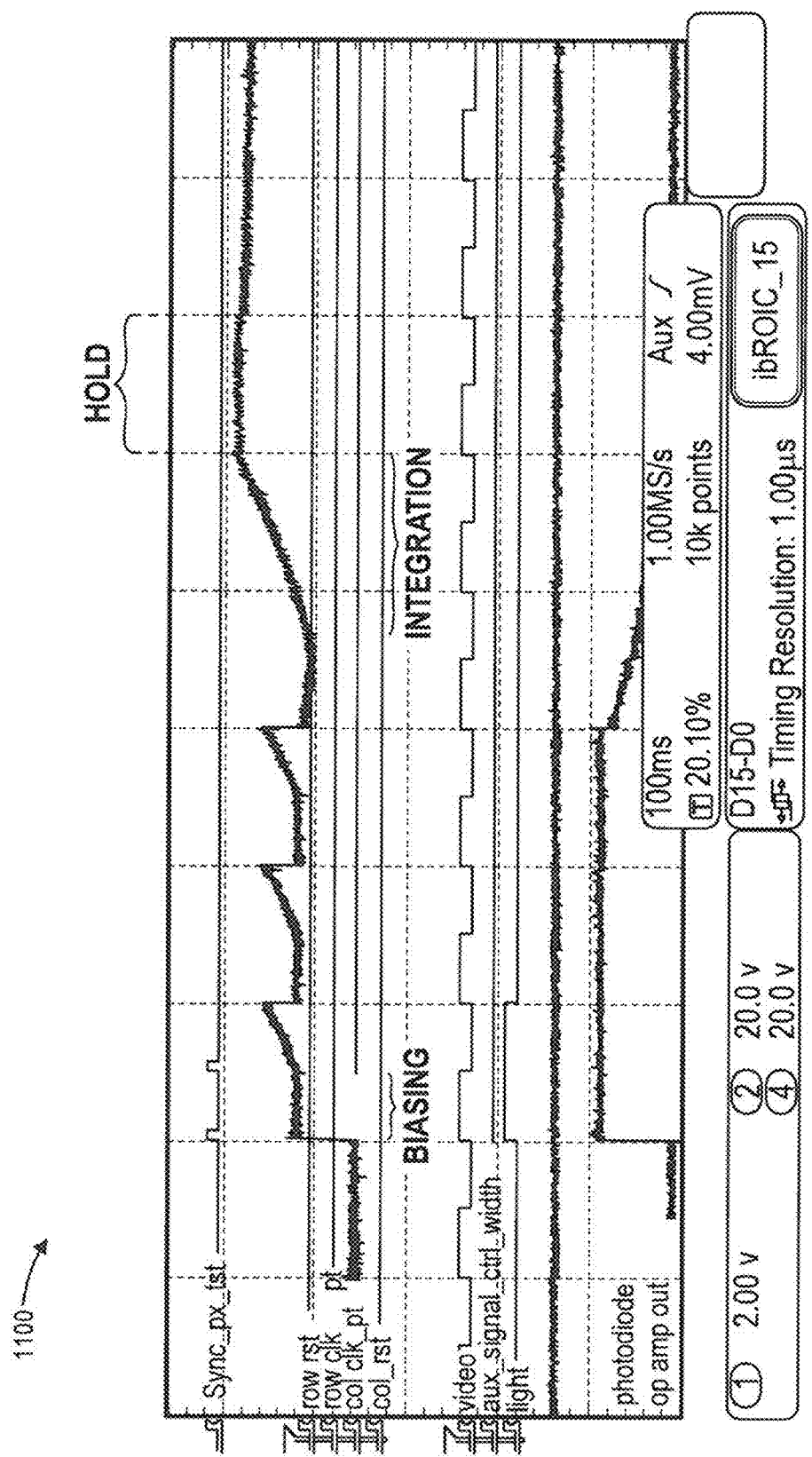
FIG. 11 shows test data for biasing, integration and hold signals on a unit cell of an embodiment.
Figure 12A:
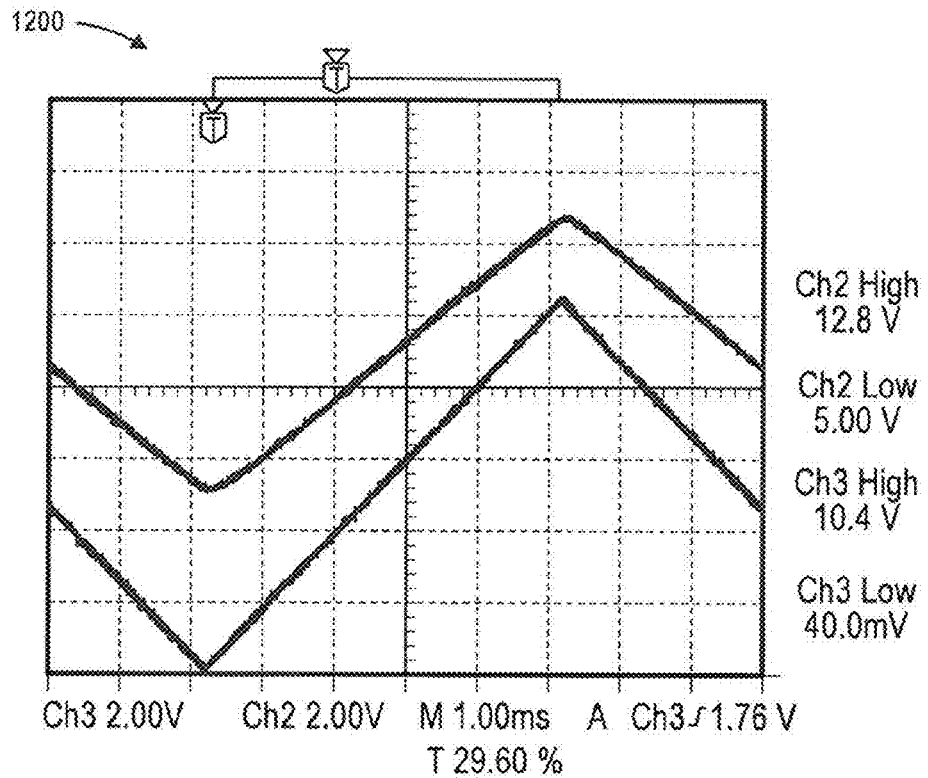
FIG. 12A shows test data for input voltage range and output swing of a unit cell of an embodiment.
Figure 12B:
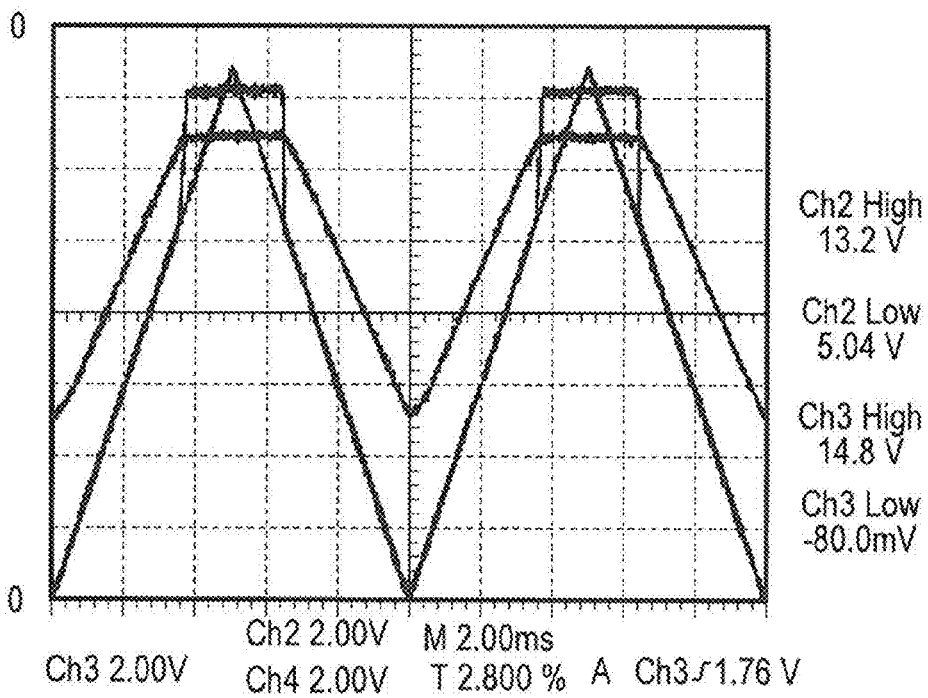
FIG. 12B shows a saturated output waveform.

The unit cell in the separated design has proven its functionality as shown on biasing, integration and holding waveforms of graph 1100 in FIG. 11. The separated unit cell also demonstrates the wide voltage range in its BIAS input as in graph 1200 at FIG. 12A, from 0.04 V to 10.4 V (+/−5 V related to 5.04 V on detector common node), and correspondent output range from 5.0 V to 12.8 V (related to VSS).

Figure 13A:
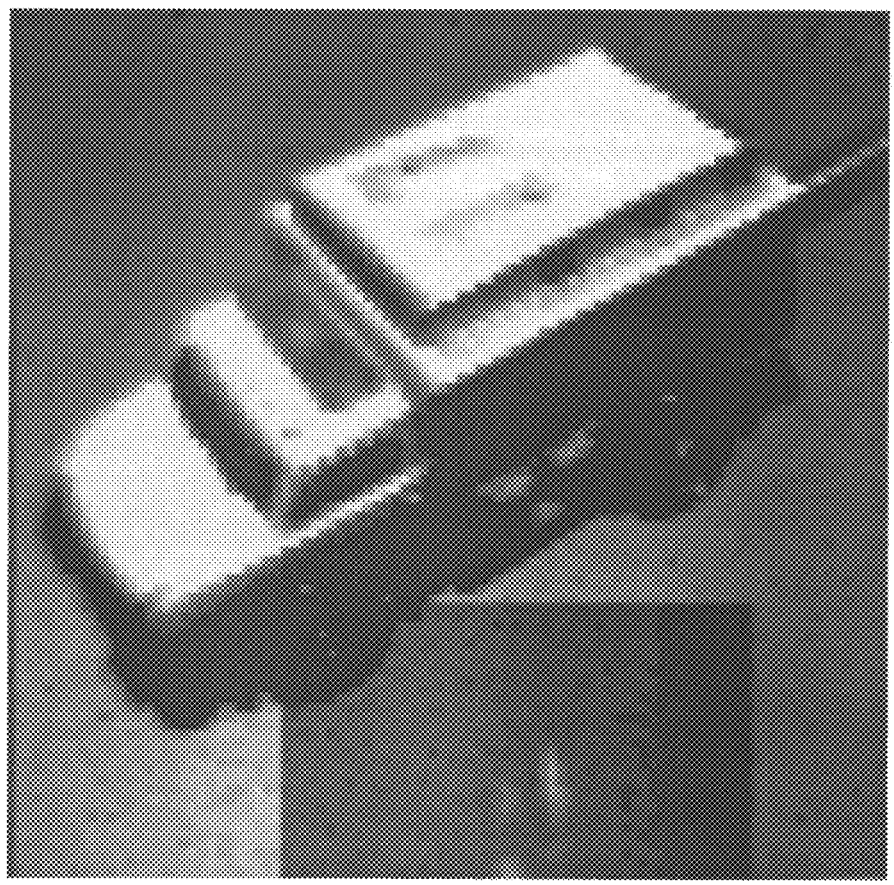
FIGS. 13A-D are frame grabber images (FIGS. 13A and 13C) and corresponding main digital and analog signals that illustrate functionality and main individual biasing feature of an ITP-ROIC of an embodiment, controlled by an FPGA-based test system.
Figure 13B:
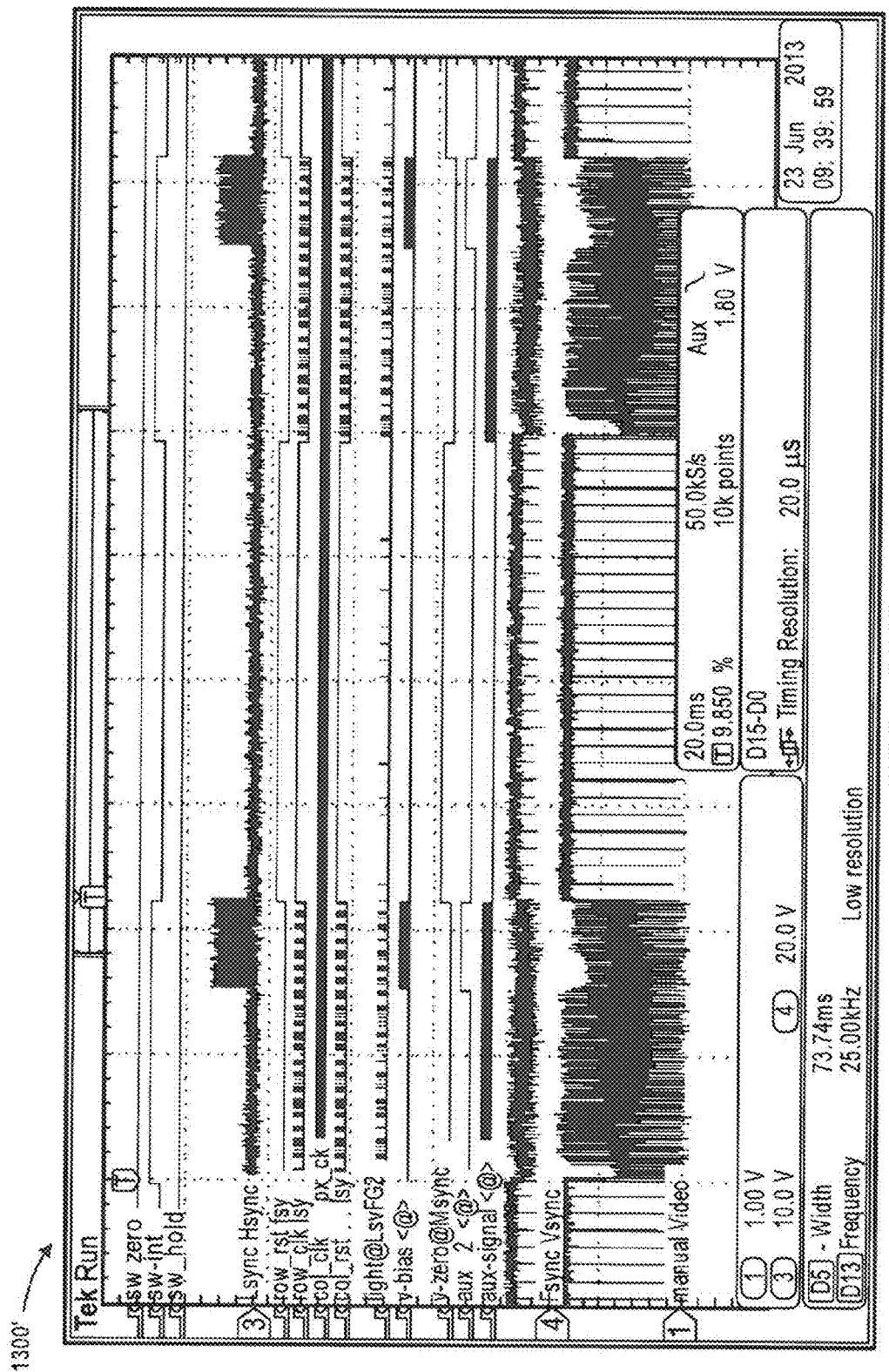
Figure 13C:
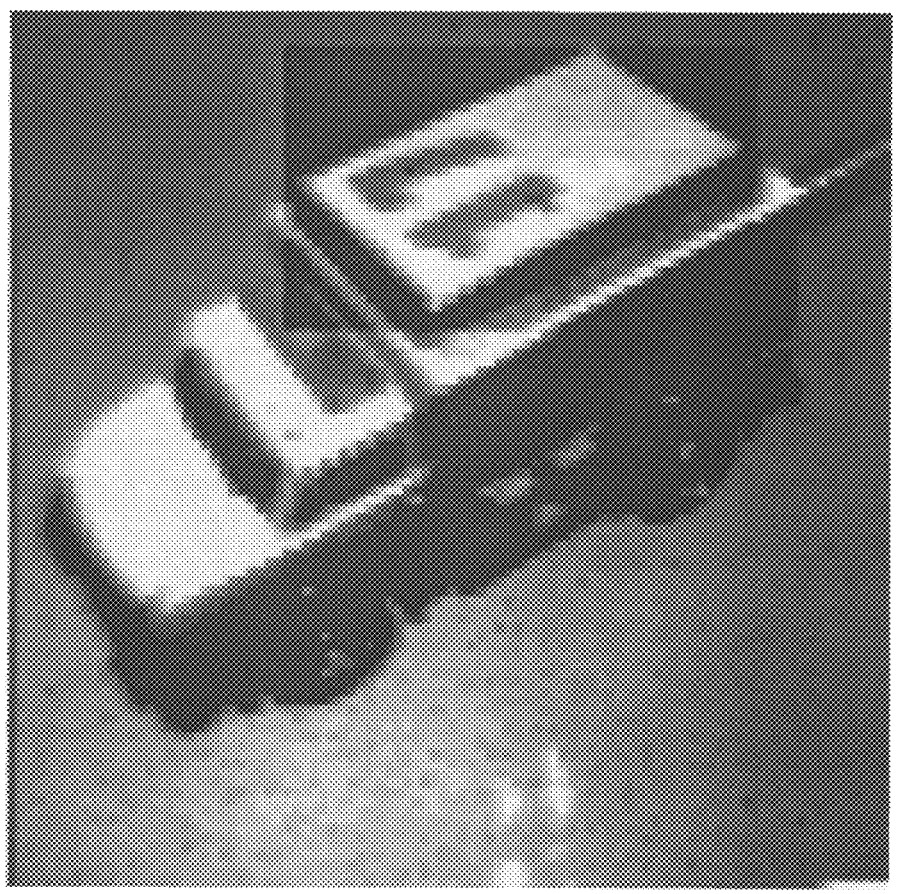
Figure 13D:
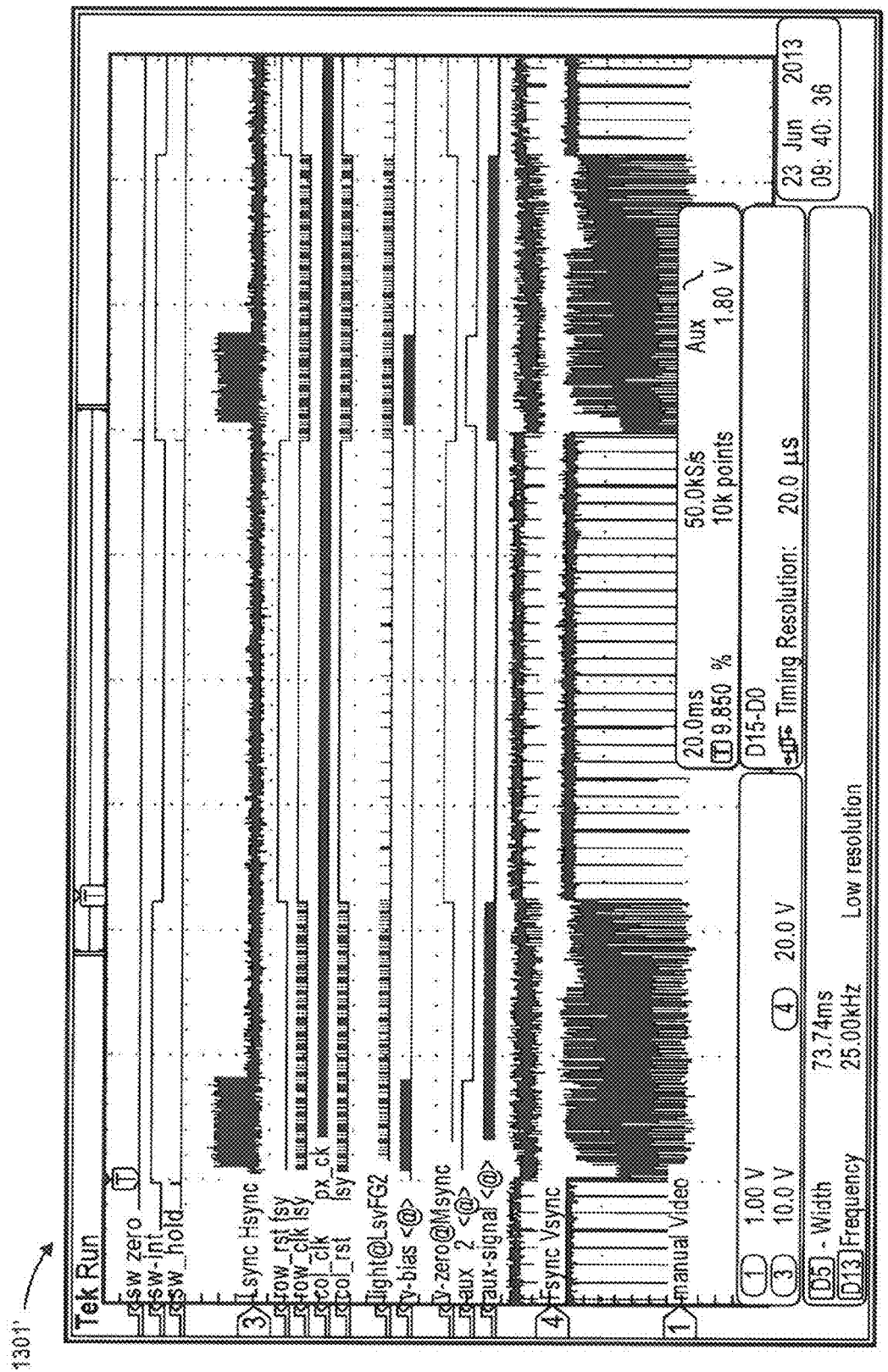

The functionality and main individual biasing feature of the ITP-ROIC, controlled by the FPGA-based test system, is also presented in the frame-grabber image 1300 in FIG. 13A and 1301 in FIG. 13C—acquired at 250 kHz of pixel clock, 4 FPS and 73.74 ms of integration time. Graph 1300' in FIG. 13B and graph 1301' in FIG. 13D shows the respective main digital and analog signals. It is noted that some features of image 1300 in FIG. 13A (i.e., at the top of the imaged truck) are hidden due to a saturation on white level. A rectangular dark area—the resolution of which can be defined at pixel level by the ITP-ROIC—with a different bias may be moved to the region of interest (ROI), reducing the gain and exposing new details of as shown in the image 1301 in FIG. 13C.

While the present teachings have been illustrated with respect to one or more implementations, alterations and/or modifications may be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages may be added or existing structural components and/or processing stages may be removed or modified.

Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising."

The term "at least one of" is used to mean one or more of the listed items may be selected. As used herein, the phrase "one or more of", for example, A, B, and C means any of the following: either A, B, or C alone; or combinations of two, such as A and B, B and C, and A and C; or combinations of three A, B and C.

The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A readout integrated circuit, comprising:
   a memory for each of a plurality of pixels, wherein the memory maintains an initial bias voltage for each pixel during an initial integration frame time and during a sample and hold readout processing time, and wherein the sample and hold readout processing time is utilized to write a subsequent bias voltage for each pixel for a subsequent integration frame time to allow a first one of the pixels to have a different bias voltage than a second one of the pixels inside each integration frame time;
   an address selector to synchronize a subsequent bias voltage for each of the pixels;
   a reference voltage recover switch to subtract the initial bias voltage from an output voltage of the integrated circuit, and to result an integrator voltage for a sample and hold block; and
   a pulse-width control circuit to prevent crosstalk of the subsequent bias voltage between the first and second pixels while a pixel clock selects adjacent columns.

2. The readout integrated circuit of claim 1, further comprising a bias voltage switch between the memory and an initial bias voltage source.

3. The readout integrated circuit of claim 1, wherein the first and second pixels are adjacent to one another.

4. The readout integrated circuit of claim 1, wherein the memory is configured to control the subsequent bias voltage for each pixel independently.

5. The readout integrated circuit of claim 1, wherein the subsequent bias voltage is from about −5 volts to about 5 volts.

6. The readout integrated circuit of claim 1, wherein the memory comprises an analog memory.

7. The readout integrated circuit of claim 1, further comprising an analog multiplexer to generate a video signal based on the output voltage.

8. The readout integrated circuit of claim 1, wherein the plurality of pixels define a focal plane array (FPA) of a detector.

9. The readout integrated circuit of claim 1, further comprising an operational amplifier in communication with the memory, wherein a voltage maintained by the memory is communicated to a detector in communication with the operational amplifier.

10. The readout integrated circuit of claim 9, further comprising an integration switch through which the voltage maintained by the memory is communicated to the detector at a start of the initial integration frame time.

11. The readout integrated circuit of claim 1, wherein the plurality of pixels are arranged as a tunable spectral response DWELL-IRFPA.

12. The readout integrated circuit of claim 1, wherein the sample and hold readout processing time is further utilized to write a subsequent voltage polarity for each pixel for a subsequent integration frame time to allow the first one of the pixels to have the different bias voltage and a different voltage polarity than the second one of the pixels inside each integration frame time.

13. The readout integrated circuit of claim 12, wherein the memory is configured to control the subsequent bias voltage and voltage polarity for each pixel independently.

14. A method for controlling a bias voltage for a plurality of pixels, comprising:
maintaining an initial bias voltage for each of a plurality of pixels during an initial integration frame time and during a sample and hold readout processing time;
writing a subsequent bias voltage for each pixel for a subsequent integration frame time to allow a first one of the pixels to have a different bias voltage than a second one of the pixels inside each integration frame time;
recovering an integrator voltage by subtracting the initial bias voltage from a total integrator output voltage;
compensating an integrator input offset voltage, a sensor voltage bias non-uniformity correction, or both on each pixel using external measuring, calculating, controlling, and feed backing of a corrected bias voltage; and
controlling of a bias-switch pulse width to avoid crosstalk between the first and second pixels, wherein the first and second pixels are adjacent to one another.

15. The method of claim 14, further comprising controlling the subsequent bias voltage for each pixel independently.

16. The method of claim 14, further comprising providing the subsequent bias voltage in both polarities on each pixel independently.

17. The method of claim 14, wherein the subsequent bias voltage is from about −5 volts to about 5 volts.

18. The method of claim 14, wherein the initial integration frame time, subsequent integration frame time or both are a time equal to or less than 245 ms.

19. The method of claim 14, wherein the initial integration frame time, subsequent integration frame time or both are a minimum integration time defined by the timing of a line-scan.

* * * * *